(12) United States Patent
Marin Paricio

(10) Patent No.: US 7,147,990 B2
(45) Date of Patent: Dec. 12, 2006

(54) PROCEDURE FOR PHOTO ENGRAVING IN HIGH DEFINITION ON METAL

(76) Inventor: Fernando Marin Paricio, 3 Wilfrid Gardens, London W3 0NQ (GB)

(\*) Notice: Subject to any disclaimer, the term of this patent is extended or adjusted under 35 U.S.C. 154(b) by 1071 days.

(21) Appl. No.: 10/053,071

(22) Filed: Jan. 18, 2002

(65) Prior Publication Data

US 2002/0097440 A1    Jul. 25, 2002

(30) Foreign Application Priority Data

Jan. 22, 2001    (ES) .................................. 200100138

(51) Int. Cl.
*G03F 7/24* (2006.01)
(52) U.S. Cl. .................... 430/292; 430/330; 216/32
(58) Field of Classification Search .................. 216/32; 430/32

See application file for complete search history.

(56) References Cited

U.S. PATENT DOCUMENTS

| | | | | |
|---|---|---|---|---|
| 5,920,977 A | * | 7/1999 | Wyckoff et al. | ............... 29/558 |
| 2004/0007558 A1 | * | 1/2004 | Sim | ............................ 216/32 |

\* cited by examiner

*Primary Examiner*—John A. McPherson
(74) *Attorney, Agent, or Firm*—Collard &Roe, P.C.

(57) ABSTRACT

Photographic engraving procedure with high definition on metal, covering the stages of: obtaining a photographic positive or negative of the image to be reproduced in the engraving, cleaning, de-greasing, polishing and shining of the metal surface where the engraving is to be made, impregnation of the surface with photosensitive emulsion, making contact between the photographic positive or negative with the surface to be engraved, using a press, exposure to actinic light, developing of the emulsion, attack of the metal with salts or acids on the areas unprotected by emulsion during the development action, stripping of the protective emulsion and cleaning of the remains of salts or acids, and application of a protective layer of transparent enamel.

4 Claims, 2 Drawing Sheets

PROCEDURE FOR PHOTO ENGRAVING IN HIGH DEFINITION ON METAL

BACKGROUND

The present invention relates to a procedure for photo engraving in high definition on metal and/or ceramic with metal covering. It is particularly useful for decorating items of metallic or ceramic jewelry and for producing high definition images on porcelain articles such as tableware and presentation pieces.

Procedures are currently known for photographic printing on metals that consist of impregnating the metal with photographic emulsion based on silver nitrates. When exposed to an actinic light a surface photograph is produced without engraving, with low resistance to friction and/or high temperatures.

Other known procedures consist of anodizing portions of aluminum to form a surface layer of absorbent oxide. A sensitizer of sales is later applied that impregnates the pores of this oxide layer. It is later exposed to actinic light and then conventional photographic developing, with a final sealing in water at 98° C.

This procedure allows for variations of chemical components used, with the image made in black or blue. The images obtained are resistant and enduring but are not engraved images. Furthermore, these procedures can only be carried out on aluminum.

Other procedures, such as the offset technique, are used on lithographic plates which have the sensitive emulsion only so that after developing and processing the positive or negative they divide the greasy element from the aqueous element, but do not produce an engraving.

Known techniques of engraving are carried out mechanically or by laser, using engraving machines, but they do not offer good quality or high definition.

When decorating on ceramics and porcelain, the present techniques require transferring of decals, using serigraphy in four colours and then processing them at high temperatures in baking ovens. The definition of the printing is very low.

SUMMARY

The procedure of the invention serves to engrave metals and/or ceramics covered with metal, in an optimum manner. The process can be carried out on various types of metals, particularly the noble metals such as gold, silver and platinum, and also on brass, and it produces high definition engravings (up to 250 lines per inch). It can also be carried out on a coating of these metals on ceramics (porcelains, tiles, etc.). It is especially useful for decorating contoured surfaces (i.e., surfaces which are not planar).

According to the invention, the first step of the procedure is obtaining a photographic positive or negative of the image to be reproduced in the engraving. The surface to be engraved is then prepared. If metallic, the preparation consists of cleaning, de-greasing and then polishing and shining. If ceramic, it consists of covering the same with a thin sheet of metal and cooking at between 700°–800° C.

The surface to be engraved or the metal covering is then impregnated with photosensitive emulsion, resistant to the chemical agents to be used. The photographic positive or negative is placed in contact with the photosensitive emulsion using a press and then exposed to actinic light. The photosensitive emulsion is developed with printed parts appearing on the areas reached by the actinic light. During this step, resolutions of up to 250 lines per inch can be obtained.

Salts or acids are used to attack the surface of the parts not protected by the printing of the photosensitive emulsion. This causes the engraving and shading, which in the case of ceramic pieces means the total disappearance of the covering layer except in the areas protected by the emulsion. The quality of the engraving obtained corresponds to the resolution obtained in the developing.

The developed photosensitive emulsion is stripped and the remains of salts or acids are de-greased and removed. Finally, a protective layer of transparent enamel, with high resistance, is applied to preserve the engraving from knocks and/or rubbing.

BRIEF DESCRIPTION OF THE DRAWINGS

Other objects and features of the present invention will become apparent from the following detailed description considered in connection with the accompanying drawings which disclose at least one embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION

Figure 1:
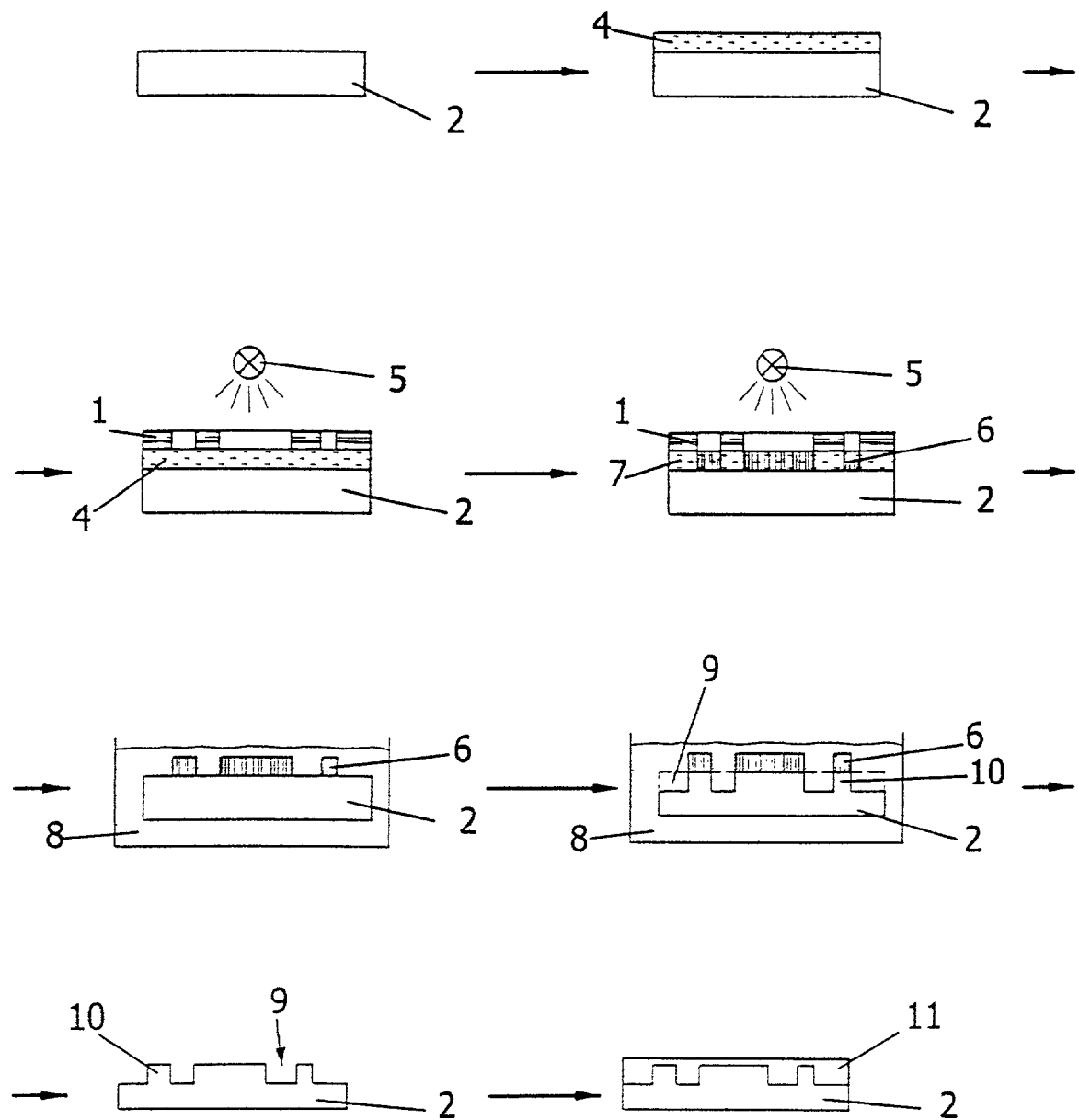
FIG. 1 shows schematically the application of the procedure of the invention onto a metal surface.
Figure 2:
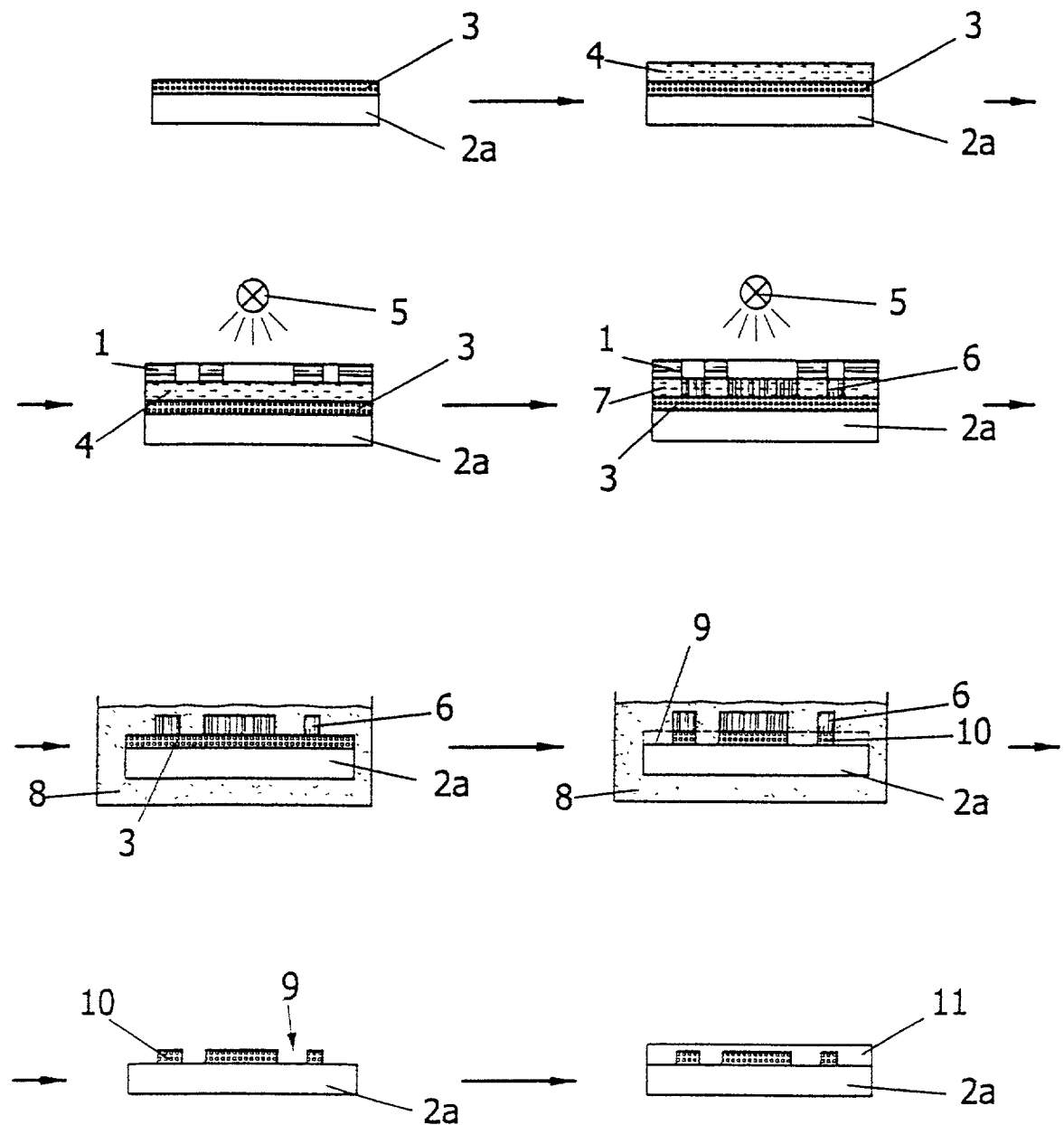
FIG. 2 shows schematically the application of the procedure of the invention onto a metal layer applied to a ceramic surface.

The procedure of the invention includes obtaining a photographic negative 1 of the image to be represented. Thereafter a surface 2 to be engraved is prepared, by carrying out cleaning, de-greasing, polishing and shining if metal. In the case of a ceramic surface $2^a$, it is prepared by applying a thin metallic layer 3 later cooked at 800° C.

This surface is then impregnated with a photosensitive photographic emulsion 4 and photographic negative 1 is placed in contact with surface 2 to be engraved using a press, not shown.

Because the articles which are to be decorated using the photographic engraving process of the present invention are not necessarily flat, but may for example be items of jewelry made of gold, silver or platinum, or even ceramic coated with such a metal, the press has been designed to adapt to the shape of the workpiece. Conventionally when a photographic emulsion is exposed on a metal surface, for example the sensitized surface of an offset printing plate, the sheet metal of the plate conforms to the more rigid transparent body through which the radiation passes before impinging on the emulsion on the plate surface. By contrast, in the present invention surface 2 bearing photographic emulsion 4 is not flexible so the pressure medium, which holds the film in contact with surface 2 of the workpiece, deforms in order to adapt to the shape adopted by the photographic film when pressed against surface 2 of the workpiece. The radiation for exposure passes through a flexible transparent body, for example a "window" of transparent low density elastomer such as synthetic rubber.

Then surface 2 with the negative in contact is exposed to a beam of actinic light 5, which causes the reaction of photosensitive emulsion on areas reached 6 by beam of actinic light 5. These areas 6 are made positive by later developing, while areas not reached 7 by beam of actinic light 5 are not printed.

Because a noble metal, for example gold or platinum, for which the process of the present invention is intended is particularly resistant to the etchant, it is necessary to expose the metal to the etchant for a considerable time. In order to ensure that the (masking) exposed parts of the emulsion are fixed sufficiently to resist any erosion or corrosion by the etchant, it is necessary to harden the emulsion this is achieved by heating it to a temperature of at least 200° C. Preferably the hardening temperature is in the range of 200 to 400° C.

After developing, the emulsion is hardened by heating it to a temperature of at least 200° C. to 400° C. The surface is then submerged in a bath of acid 8 which produces the engraving and shading of those metallic areas 9 which are without printed photosensitive emulsion, which in the case of the thin metallic layer over the porcelain means the total disappearance of metallic layer 3 in these areas.

The next step consists of stripping the photographic emulsion and eliminating the remains of acid, leaving protected zones 10 of the metal uncovered. Protected zones 10 stand out in relief with respect to areas 9 where the engraving has taken place.

Lastly, a protective layer 11 of high mechanical resistance transparent enamel is applied to protect the engraving.

The high definition of micro-engraving achievable with the process of the present invention allows the engraving of a half-tone photographic image on a noble metal or on the metalized surface of a ceramic workpiece.

Accordingly, while at least one embodiment of the present invention has been shown and described, it is to be understood that many changes and modifications may be made thereunto without departing from the spirit and scope of the invention as defined in the appended claims.

What is claimed is:

1. A photographic engraving process to provide an engraving with high definition on a contoured metal surface, comprising the steps of:

obtaining a photographic positive or negative of the image to be reproduced in the engraving;

cleaning, degreasing, and polishing the metal surface where the engraving is to be made;

impregnating said metal surface with photosensitive emulsion;

making contact between said surface to be engraved and said photographic positive or negative, using a press in which exposing radiation passes through a pressure-applying medium which deforms to adapt to the contours of said emulsion-bearing surface;

exposing said surface to actinic light through the photographic positive or negative and said pressure-applying medium;

developing said emulsion;

attacking the metal surface with salts or acids on the areas unprotected by emulsion;

stripping said protective emulsion and cleaning the remains of said salts or acids; and applying a protective layer of transparent enamel.

2. The process according to claim 1, wherein said metal surface to be treated consists of a thin metal film applied to a ceramic surface, and further comprising the step of baking of the whole at temperatures of from 700° to 800° C.

3. The process according to claim 1 further comprising a step of hardening said developed emulsion by heating it to a temperature of at least 200° C.

4. A process according to claim 3, wherein said hardening is at a temperature of from 200° C. to 400° C.

* * * * *